(12) United States Patent
Saito et al.

(10) Patent No.: US 6,253,902 B1
(45) Date of Patent: *Jul. 3, 2001

(54) ELECTRONIC COMPONENT SUPPLYING APPARATUS

(75) Inventors: Koji Saito; Taro Yasuda, both of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/676,246

(22) Filed: Sep. 29, 2000

Related U.S. Application Data

(63) Continuation of application No. 09/262,024, filed on Mar. 4, 1999, now Pat. No. 6,135,264.

(30) Foreign Application Priority Data

Mar. 4, 1998 (JP) ................................................. H10-51991

(51) Int. Cl.[7] ................................................. B65G 47/44
(52) U.S. Cl. ................................................. 198/396
(58) Field of Search ................................................. 198/396, 530, 198/531, 459.6, 459.7, 468.01, 465.5, 468.9, 463.4

(56) References Cited

U.S. PATENT DOCUMENTS

| | | |
|---|---|---|
| 4,469,709 | 9/1984 | Schrauf . |
| 5,525,023 | 6/1996 | Sage et al. . |
| 5,636,725 | 6/1997 | Saito et al. . |
| 5,836,437 * | 11/1998 | Saito et al. ............................ 198/396 |
| 6,032,783 | 3/2000 | Saito et al. ............................ 198/390 |
| 6,102,188 * | 8/2000 | Saito et al. ........................ 198/396 X |
| 6,135,264 * | 10/2000 | Saito et al. ............................ 198/396 |
| 6,152,283 * | 11/2000 | Kondo et al. ......................... 198/396 |

FOREIGN PATENT DOCUMENTS 6-232596   8/1994   (JP) .

* cited by examiner

Primary Examiner—James R. Bidwell
(74) Attorney, Agent, or Firm—Lowe Hauptman Gilman & Berner, LLP

(57) ABSTRACT

An electronic component supplying apparatus conveys electronic components in an aligned state to supply the same to a predetermined taking-out position. When a leading chip component abuts on a component stopper and a component conveyance is stopped, a plurality of the chip components including the leading chip component are covered in a non-contacting state by a slider, the leading chip component which has abutted on the component stopper is attracted to the component stopper. In a state where the component conveyance by the conveying path is stopped, the component stopper is displaced in a component conveying direction, the leading chip component is separated from a second leading chip component, and also the slider is displaced in a direction opposite to the component conveying direction, so that the slider covering is uncovered, and the leading chip component is allowed to be taken out.

13 Claims, 7 Drawing Sheets

ELECTRONIC COMPONENT SUPPLYING APPARATUS

This application is a Continuation of application Ser. No. 09/262,024 filed Mar. 4, 1999, U.S. Pat. No. 6,135,264.

BACKGROUND OF THE INVENTION

1. Field of the Invention

The present invention relates to an electronic component supplying apparatus for conveying electronic components in an aligned state to supply the same at a predetermined taking-out position.

2. Description of the Related Art

There has been disclosed in Japanese Patent Application Laid-Open No. Hei 6-232596 an apparatus provided with a belt for conveying chip components, a ratchet mechanism for intermittently moving the belt, a grooved cover for aligning the chip components on the belt, a stopper for stopping the chip components conveyed by the belt, and a stopper displacement mechanism for separating a leading chip component from the stopper after the belt movement stops.

The electronic components conveyed in an aligned state by the belt stop when a leading electronic component thereof abuts on the stopper. When the belt movement stops, the stopper is separated from the leading chip component and the leading chip component is taken out by a suction nozzle. The chip taken out by the suction nozzle is mounted on a substrate or the like.

In the apparatus, the stopper is displaced so as to be separated from the leading chip component after the belt movement is stopped. However, there is a drawback that, since the leading chip component is kept in contact with the second leading chip component, the leading chip component interferes with the second leading chip component to fail to be taken out when the leading chip component is taken out by the suction nozzle.

Specifically, when the leading chip component is lifted up by the suction nozzle in the state where the leading chip component is in contact with the second leading chip component, a similar lifting force acts on the second leading chip component to cause an inclination or flying-out of the second leading chip component, thereby preventing the subsequent chip components from being taken out. Also, a position deviation occurs in the electronic component absorbed by the suction nozzle, which results in reduction in position accuracy in component placement onto a substrate or the like.

SUMMARY OF THE INVENTION

An object of the present invention is to provide a novel electronic component supplying apparatus capable of preventing the failure in taking-out as described above.

In order to achieve the object, the present invention comprises a conveying path for intermittently conveying electronic components in an aligned state in a predetermined direction; a component stopper on which a leading electronic component of the electronic components abuts during a component conveyance; a component suction portion for sucking the leading electronic component which has abutted on the component stopper; a slider for covering at least the leading electronic component which has abutted on the component stopper in a non-contacting state; a stopper displacement mechanism for displacing the component stopper in a component conveying direction in a state where the component conveyance by the conveying path is stopped to separate the leading electronic component from a second leading electronic component; and a slider displacement mechanism for displacing the slider in a direction opposite to the component conveying direction in the state where the component conveyance by the conveying path is stopped to allow the leading electronic component to be taken out.

When the leading electronic component abuts on the component stopper so that the component conveyance is stopped, at least the leading electronic component which has abutted on the component stopper is covered in a non-contacting state by the slider and the leading electronic component abutting on the component stopper is sucked by the component stopper. In a state where the component conveyance by the conveying path is stopped, the component stopper is displaced in the component conveying direction and the leading electronic component sucked to the component stopper is separated from the second leading electronic component. Then, the slider is displaced in the direction opposite to the component conveying direction and the covering with the slider is cancelled, thereby allowing the leading electronic component to be taken out.

That is, as at least the leading electronic component is covered in the non-contacting state by the slider until the leading electronic component abuts on the component stopper to be stopped, the leading electronic component is prevented from standing up or flying out outwards due to a force generated at a time of the component conveyance of the electronic components. Also, the leading electronic component is separated from the second leading electronic component and the leading electronic component is taken out in the state where the leading electronic component covered with the slider is uncovered, so that the leading electronic component is prevented from interfering with the second leading electronic component when the leading electronic component is taken out by a sucking nozzle or the like. Accordingly, the problems can be overcome about the failure in taking-out which has conventionally occurred due to the interference between the electronic components, and taking-out of the electronic components from the apparatus can be performed much satisfactorily.

The above object, the other objects, features and advantages of the present invention will be apparent from the following explanation and the accompanying drawings.

DESCRIPTION OF THE PREFERRED EMBODIMENTS

Figure 1:
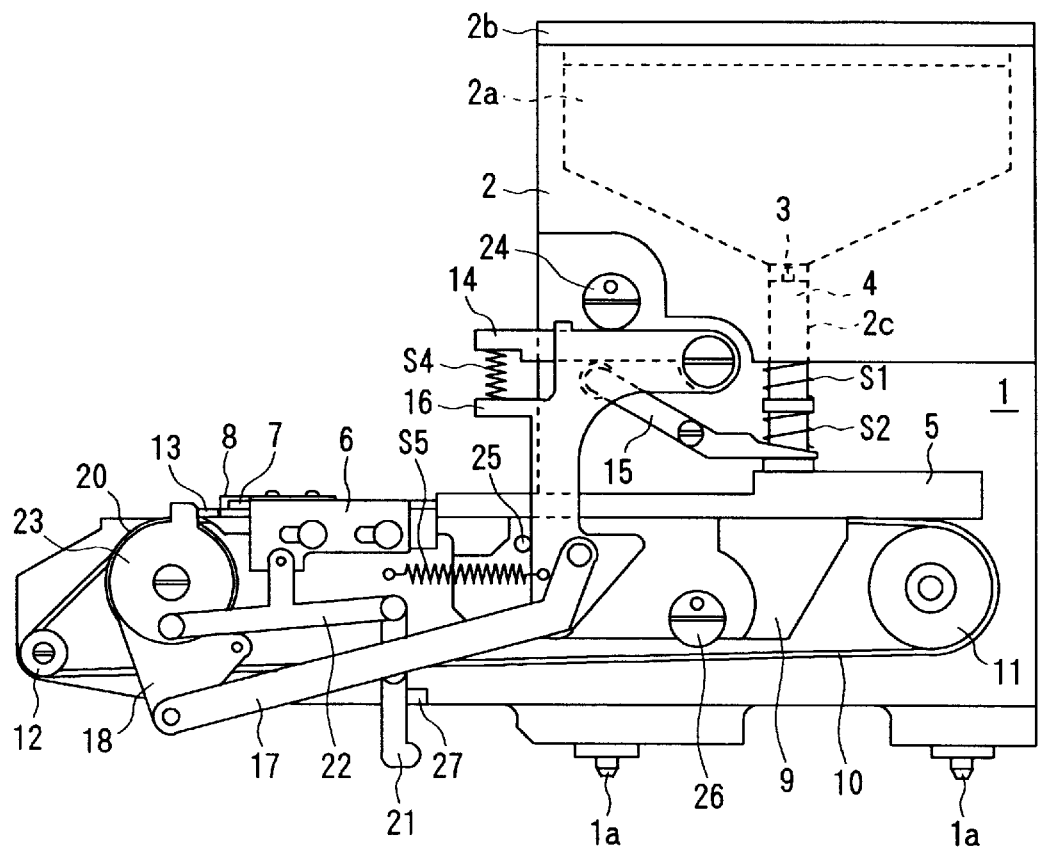
FIG. 1 is a side view showing an apparatus according to a preferred embodiment of the present invention.
Figure 2:
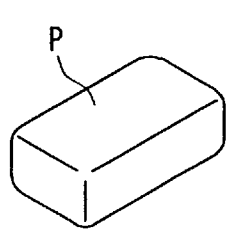
FIGS. 2(A) to 2(C) are perspective views showing configuration examples of chip components used in the apparatus shown in FIG. 1.
Figure 2:
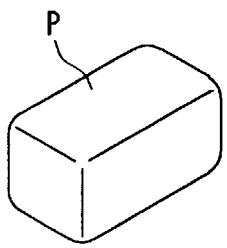
Figure 2:
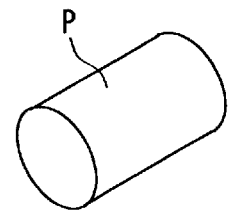

FIGS. 1 to 10(C) show a preferred embodiment of the present invention. In FIGS. 1 to 10(C), reference numeral 1 denotes a frame, 2 a hopper, 3 a fixed pipe, 4 a movable pipe, 5 a component guide, 6 a slider driving plate, 7 a slider guide, 8 a slider, 9 a belt guide, 10 a belt, 11 a pair of main pulleys, 12 a sub-pulley, 13 a component stopper, 14 a first operating lever, 15 a pipe driving lever, 16 a ratchet driving lever, 17 a relay lever, 18 a ratchet driving plate, 19 a ratchet, 20 a ratchet wheel, 21 a second operating lever, 22 a relay lever, 23 a stopper driving plate, 24 to 27 positioning stoppers, S1 to S7 coil springs, and P a chip component. It is to be noted that left and right in FIG. 1 are represented as front and rear, respectively.

The frame 1 serves so as to support respective devices or units constituting an apparatus of the embodiment. The frame 1 is provided at its lower face with positioning pins 1a insertable into positioning holes provided on a fixed table, a movable table or the like (not shown).

The hopper 2 is provided with a storage chamber 2a, a lid 2b for covering an upper end opening of the storage chamber 2a so as to be freely opened and closed, and a through hole 2c formed at a bottom surface of the storage chamber 2a. The cross-sectional configuration of the through hole 2c conforms to the outer configuration of the movable pipe 4. A large number of chip components P having one kind of prismatic shapes and a cylindrical shape shown in FIGS. 2(A) to 2(C) are stored in bulk in the storage chamber 2a. The chip component P is, for example, a chip condenser, a chip resister, a chip inductor, or the like. The chip component P has such a metal portion as an external electrode, an internal conductor or the like, and can be attracted and held by a permanent magnet described later. Of course, if electronic components, for example, such a composite component as a LC filter or a network, or such an integrated circuit component as a semiconductor device, have configurations similar to those shown in FIGS. 2(A) and 2(C), they can be handled as electronic components to be supplied by the apparatus.

Fixed pipe 3 comprises a pipe whose inner hole has a rectangular cross section or circular cross section. The fixed pipe 3 is fixed at its lower end to a pipe fitting hole 5c of the component guide 5 and arranged vertically into a through hole 2c at a central position of the hole 2c. In the mounted situation of the fixed pipe 3, the height of the upper end of the fixed pipe 3 approximately conforms to that of the through hole 2c. When the cross-sectional configuration of the inner hole of the fixed pipe 3 is rectangular, the cross-sectional shape of the inner hall is set to be slightly larger than the end face shape of the chip component P. Also, when the cross-sectional configuration of the inner hole of the fixed pipe 3 is circular, the diameter of the inner hole is set to be slightly larger than the maximum length of the end face of the chip component P.

The movable pipe 4 comprises a pipe having an inner shape approximately conforming to the outer shape of the fixed pipe 3 and a thickness larger than the maximum length of the end face of the chip component P. The movable pipe 4 is disposed in an annular space between the through hole 2c and the fixed pipe 3 so as to move up and down. In a state where the lower end of the movable pipe 4 is in contact with the component guide 5, the height of the lower end of the movable pipe 4 is slightly lower than that of the upper end of the through hole 2c. The movable pipe 4 has a guide face 4a formed in a conical shape at an upper end thereof, and is provided at an intermediate outer surface and a lower end outer surface thereof with annular engaging flanges 4b and 4c. Also, coil springs S1 and S2 having a relationship of S1<S2 in a biasing force are fitted on the movable pipe 4 above and below the upper side engaging flange 4b. In a standby state, the lower end of the movable pipe 4 is in contact with the component guide 5 by the urging force of the coil spring S1.

The component guide 5 has a curved path 5a inside thereof and a liner groove 5b contiguous to an end of the curved path 5a at a lower face thereof. The curved path 5a is contiguous to the pipe fitting hole 5c, and the linear groove 5b extends up to the front end of the component guide 5. The curved path 5a has a predetermined radius of curvature at a center of the path and the angular range of the path 5a is about 90° as viewed from the side of the path 5. A surface of the belt 10 is in contact with a lower surface of the component guide 5, and a lower side opening of the linear groove 5b is closed by a surface of the belt 10. Both the cross-sectional configurations of the curved path 5a and the linear groove 5b are rectangular and are set to be slightly larger than the end face configuration of the chip component P.

Also, the front portion of the component guide 5 is formed in an approximately flatly notched shape at an upper surface portion thereof, and the linear groove 5b of the notched portion 5d is opened at both upper and lower faces thereof. A guide face 5e for guiding the slider driving plate 6 in the front and rear directions is provided on one side surface of the notched portion 5d. Two mounting holes 5f for a guide pin are formed in the guide face 5e.

The slider driving plate 6 comprises a plate member formed in an inverse L shape, as viewed from the front. The slider driving plate 6 is provided at the vertical portion thereof with two guide holes 6a extending in a longitudinal direction. Also, the slider driving plate 6 is provided at the vertical portion thereof with a recessed portion 6c which a roller 22b of a relay lever 22 is inserted in and engaged with. The lower surface of the horizontal portion of the slider driving plate 6 is in contact with an upper surface of the notched portion 5d, and, in a state where an inner surface of the vertical portion is in contact with the guide face 5e, and guide pins 6b are fitted into mounting holes 5f of the guide face 5e through respective guide holes 6a, thereby the slider driving plate 6 is arranged at a front portion of the component guide 5 so as to be moved backward and forward.

The slider guide 7 comprises a plate member with a configuration approximately conforming to a configuration of a region other than an arrangement region of the slider driving plate 6 on an upper surface of the notched portion 5d. The slider guide 7 has a linear slit 7a extending from the front end towards the rear end. The width of the slit 7a is smaller than that of the chip component P, and the length thereof is smaller than that of the linear groove 5b of the notched portion 5d. The slider guide 7 is fixed to the front portion of the component guide 7 by means of screws or the like in a state that the lower surface thereof is in contact with the upper surface of the notched portion 5d. In the fixed state, the center of the slit 7a in the width direction conforms to the center of the linear groove 5b in the width direction. Also, the longitudinal size of the slider guide 7 is set to be shorter than that of the upper face on the notched portion 5d. In the fixed state, also, the front ends of the notched portion 5d and the linear groove 5b slightly project from the front end of the slide guide 7. In the present embodiment, the projecting portion of the linear groove 5b serves as a component taking-out port.

The slider 8 comprises a rectangular plate member having a thickness slightly smaller than the width of the slit 7a and a length shorter than the longitudinal length of the slit 7a. The slider 8 is fixed to a horizontal portion of the slider driving plate 6 via a coupling member 8a. In a state where the slider driving plate 6 is mounted to a front portion of the component guide 5, the lower portion of the slider 8 is inserted in the slit 7a so as to be moved backward and forward. As shown in FIG. 5(C), a lower face of the slider 8 which has been inserted into the slit 7a covers some chip components P including a leading chip component P in a non-contacting state.

The belt guide 9 is provided at its upper face with a linear groove 9a having a width slightly larger than that of the belt 10 and a depth slightly larger than the thickness of the belt 10. The belt guide 9 is disposed under the component guide 5 such that the center of the linear groove 9a in the widthwise direction conforms to the center of the linear groove 5b in the widthwise direction.

The belt 10 comprises a non-magnetic flat belt or timing belt made of such a material as a synthetic rubber or a soft resin. The belt 10 is wound about the pair of main pulleys 11 disposed at the front and rear positions of the belt guide 9 and the sub-pulley 12 disposed at an oblique and lower front position of the front side pulley 11 with a predetermined tension. An upper portion of the belt 10 positioned between the main pulleys 10 is movable backward and forward within the linear groove 9a, the surface of the upper portion is put movably in contact with the lower surface of the component guide 5.

The component stopper 13 comprises a rectangular plate member having a length larger than the width of the belt 10 and a thickness approximately equal to the depth of the linear groove 5b of the component guide 5. The component stopper 13 is rotatably supported at its one end to the frame 1 through a pin 13a such that a rear face of the component stopper 13 can abut on a front end of the component guide 5. The rear face of the component stopper 13 is formed at its center with an almost semi-circular recess 13a. Also, a cubic rare earth permanent magnet 13c is embedded in the component stopper 13 below the recess 13a such that one of N and S poles thereof faces the front end of the linear groove 5b. Furthermore, a coil spring S3 for urging the component stopper 13 clockwise in FIG. 5(A) is arranged between a portion of the component stopper 13 near its one end and the frame 1.

The first operating lever 14 is rotatably supported at its one end by the frame 1 below the hopper 2 via a pin 14a. Also, the positioning stopper 24 for defining a return position of the first operating lever 14 is provided on the frame 1 above the first operating lever 14. The positioning stopper 24 comprises a disk and a screw for fixing the disk at an eccentric position, and the return position of the first operating lever 14 can finely be adjusted by changing the orientation of the disk.

The pipe driving lever 15 is rotatably supported at its central portion by the frame 1 below the first operating lever 14 through a pin 15a. Also, one end of the pipe driving lever 15 is rotatably provided with a roller 15b abutting on a lower face of the first operating lever 14. Further, the other end of the pipe driving lever 15 is provided with an engaging portion 15c comprising a U-shaped groove. The engaging portion 15c is inserted between the lower side flange 4c and the coil spring S2.

The ratchet driving lever 16 is rotatably supported at one end thereof by the frame 1 below the first operating lever 14 via the pin 14a common to the first operating lever 14. A coil spring S4 is disposed between the ratchet driving lever 16 and the first operating lever 14, and the ratchet driving lever 16 is pushed downward via the coil spring S4 when the end portion of the first operating lever 14 is pushed downward. Also, a positioning stopper 25 for defining a return position of the ratchet driving lever 16 is provided in front side of the ratchet driving lever 16 of the belt guide 9. Furthermore, a coil spring S5 for biasing the ratchet driving lever 16 clockwise in FIG. 1 is disposed between the ratchet driving lever 16 and the frame 1. That is, in a standby state, the front face of the ratchet driving lever 16 abuts on the positioning stopper 25. Furthermore, a positioning stopper 26 for defining a rotational limit position of the ratchet driving lever 16 is provided to the belt guide 9 at a rear side of the ratchet driving lever 16. The positioning stopper 26 comprises a disk and a screw for fixing the disk at an eccentric position, and the rotational limit position can finely be adjusted by changing the orientation of the ratchet driving lever 16.

The relay lever 17 is rotatably connected through its front end to the ratchet driving lever 16, and rotatably connected through its rear end to the ratchet driving plate 18. The relay lever 17 serves so as to transmit the rotational displacement of the ratchet driving lever 16 to the ratchet driving plate 18.

The ratchet driving plate 18 comprises a disk plate with an extended portion at a lower portion thereof, and is rotatably supported by a shaft 11a of the front side main pulley 11.

The ratchet 19 comprises a member with an acute end, and is rotatably supported at one end thereof by the ratchet driving plate 18 via a pin 19a. The ratchet 19 is biased counterclockwise in FIG. 4 by the coil spring S6 disposed around a pin portion, and the acute end thereof is engaged with a groove of the ratchet wheel 20.

The ratchet wheel 20 comprises a disk with a diameter approximately equal to that of the front side main pulley 11, and is fixed to the shaft 11a of the front side pulley 11 or a side face thereof such that the rotational centers conform to each other. Also, an outer periphery of the ratchet wheel 20 has a plurality of V-shaped grooves (not shown) engaged with the acute end of the ratchet wheel 19 at predetermined angular intervals.

The second operating lever 21 is rotatably supported at its central portion by the frame 1 below the belt guide 9 through a pin 21a. Also, a positioning stopper 27 for defining a return position of the second operating lever 21 is provided on the frame 1 at the rear side of the second operating lever 21. Further, a coil spring S7 for biasing the second operating lever 21 counterclockwise in FIG. 5(B) is disposed between the upper end of the second operating lever 21 and the frame 1. Namely, in a standby state, the right side face of the second operating lever 21 abuts on the positioning stopper 27.

The relay lever 22 is rotatably connected through a rear end thereof to the second operating lever 21 and is rotatably connected through an front end thereof to the stopper driving plate 23. The relay lever 22 serves so as to transmit a rotational displacement of the second operating lever 21 to the stopper driving plate 23. Also, the relay lever 22 has a upward-extending portion 22b at a central portion thereof, and a roller 22b which is inserted into and engaged with the recessed portion 6c of the slider driving plate 6 is rotatably attached at the portion 22b. That is, the relay lever 22 also serves so as to transmit a rotational displacement of the second operating lever 21 to the slider driving plate 6.

The stopper driving plate 23 comprises a disk with a diameter approximately equal to that of the front side main pulley 11, and is rotatably supported by the shaft 11a of the front side main pulley 11 such that the rotational center thereof conforms to that of the front side main pulley 11. Also, a projection 23a abutting on the front face of the component stopper 13 is provided at a portion (an upper side in FIG. 5(B) of an outer periphery of the stopper driving plate 23.

It should be noted that in the present embodiment a movable pipe upward and downward moving mechanism is configured by the first operating lever 14 and the pipe driving lever 15. Also, a belt feeding mechanism is configured by the ratchet driving lever 16, the relay lever 17, the ratchet driving plate 18, the ratchet 19 and the ratchet wheel 20. Further, a slider displacement mechanism is configured by the second operating lever 21, the relay lever 22 and the slider driving plate 6, and a stopper displacement mechanism is configured by the second operating lever 21, the relay lever 22 and the stopper driving plate 23.

An operation of the present embodiment will be described below.

In the standby state shown in FIGS. 1 to 6, the first operating lever 14 abuts on the stopper 24, the movable pipe 4 is put in a lowered position, and the belt 10 is stopped. Also, the second operating lever 21 abuts on the stopper 27, and the rear face of the component stopper 13 abuts on the front end of the component guide 5 by pressure given by the projection 23a of the stopper driving plate 23. Further, the slider 8 is put in an advanced position where the front end thereof conforms to the front end of the linear groove 5b.

The first operating lever 14 and the second operating lever 21 are operated in such an order that, after the first operating lever 14 is pushed by a portion interlocked to a suction nozzle (not shown) or other driving units and the pushing is released, the second operating lever 21 is pushed and the pushing is released. Also, taking-out of the chip components P effected by the suction nozzle is performed while the second operating lever 21 is being pressed.

Figure 3:
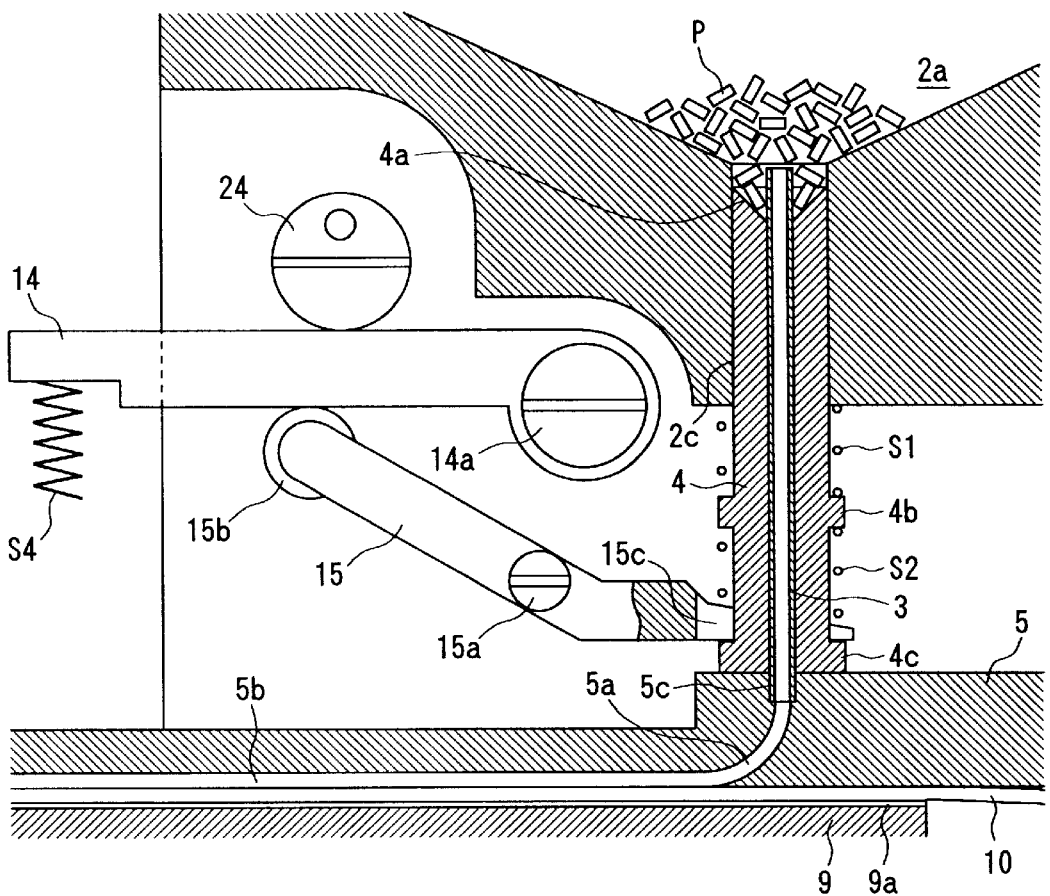
FIG. 3 is a longitudinal sectional view of a component taking-in portion of the apparatus shown in FIG. 1.
Figure 4:
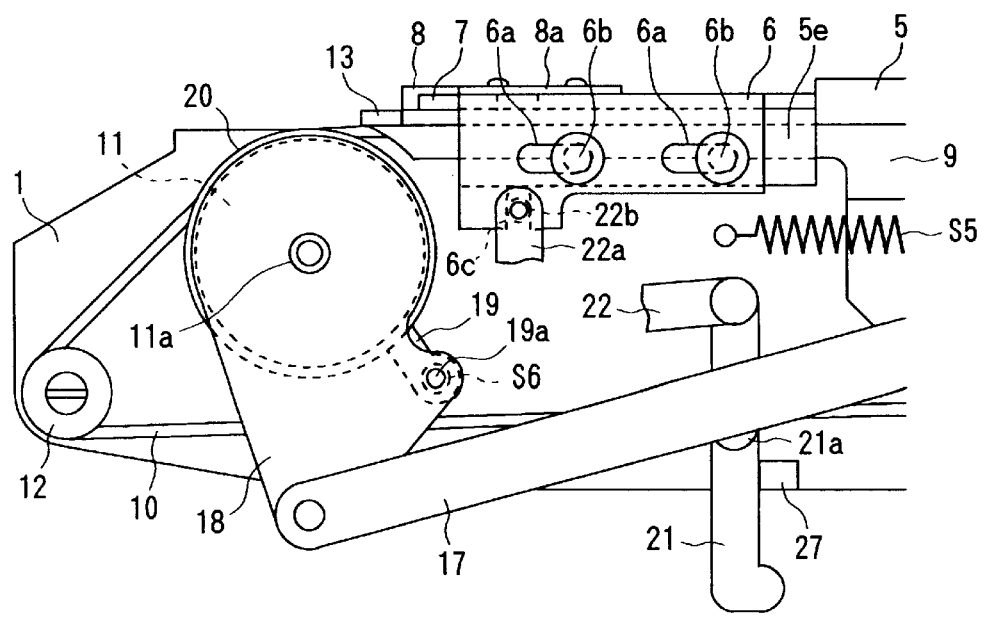
FIG. 4 is a side view of a front side main pulley portion of the apparatus shown in FIG. 1 from which a stopper driving plate is removed.
Figure 5:
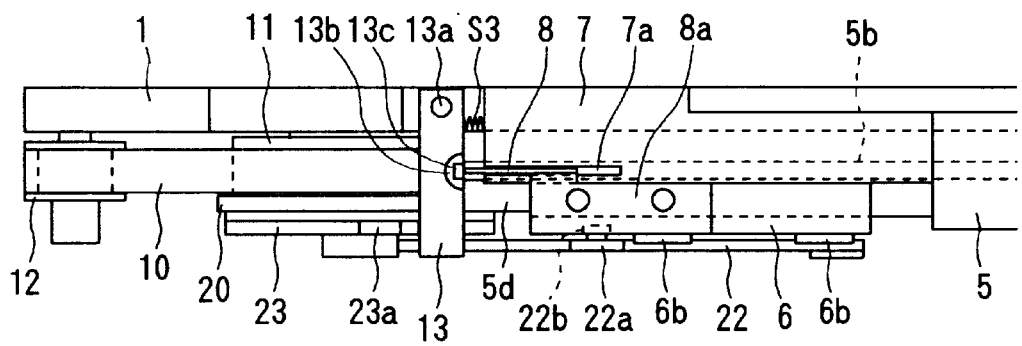
FIG. 5(A) is a plan view of a front portion in the apparatus shown in FIG. 1.
FIG. 5(B) is a side view of FIG. 5(A)
FIG. 5(C) is a partially enlarged longitudinal sectional view of FIG. 5(B)
Figure 5:
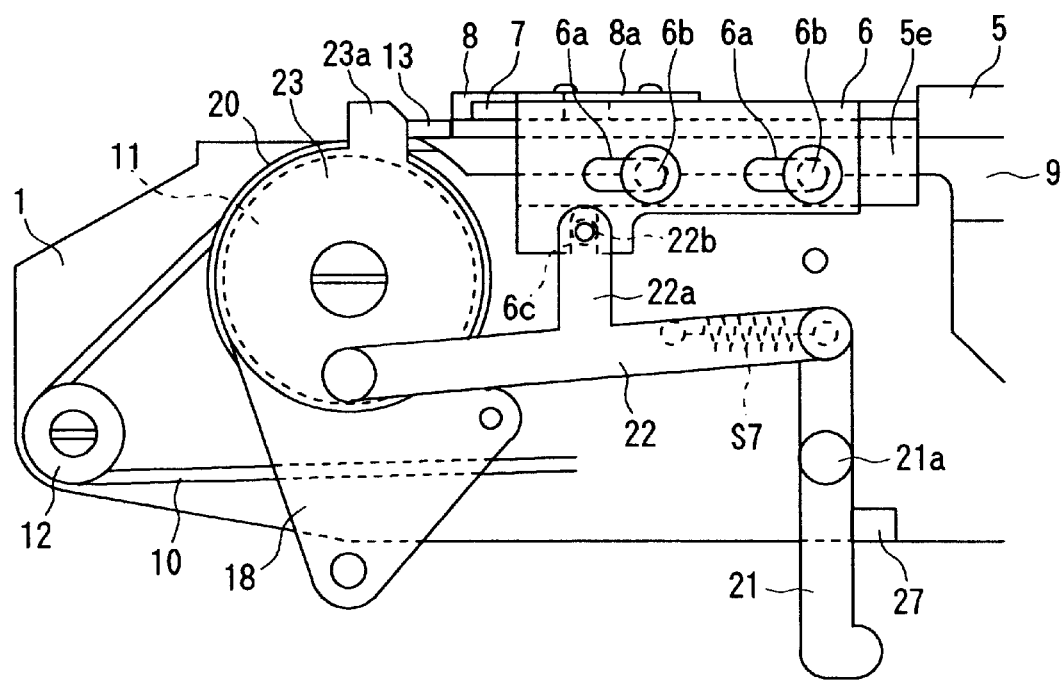
Figure 5:
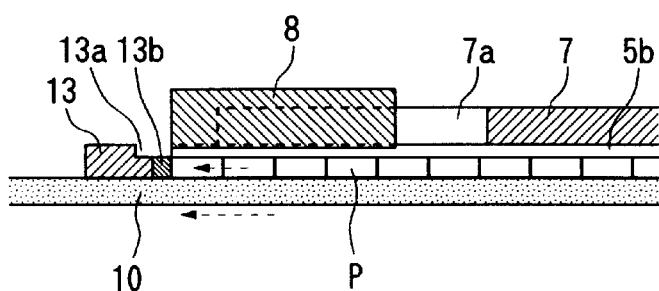
Figure 6:
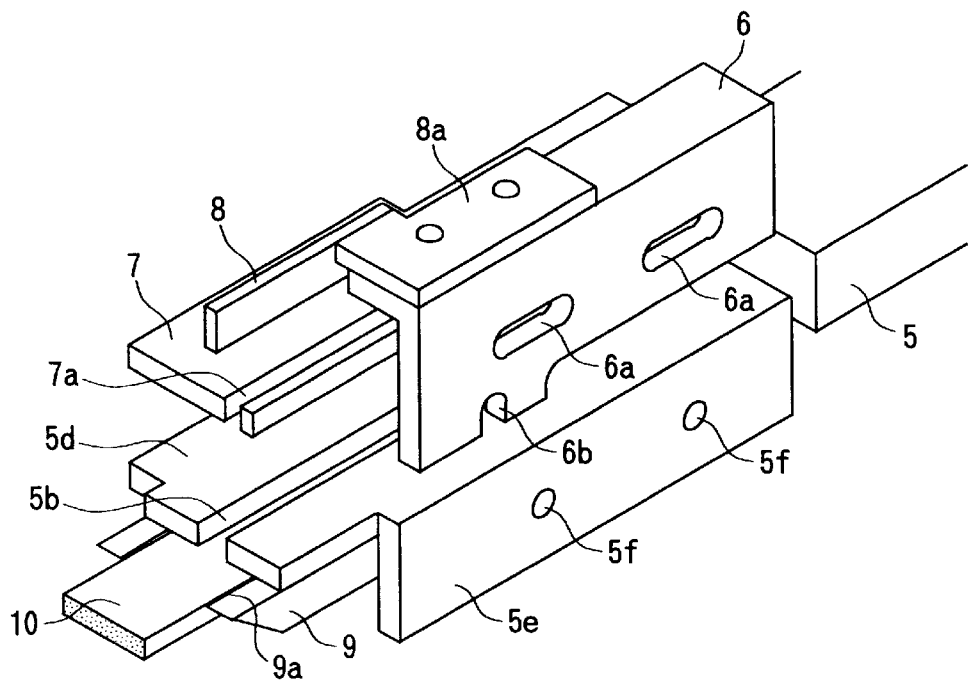
FIG. 6 is an exploded perspective view showing a component guide, a slider driving plate, a slider guide, a belt guide and a belt of the apparatus in FIG. 1.
Figure 7:
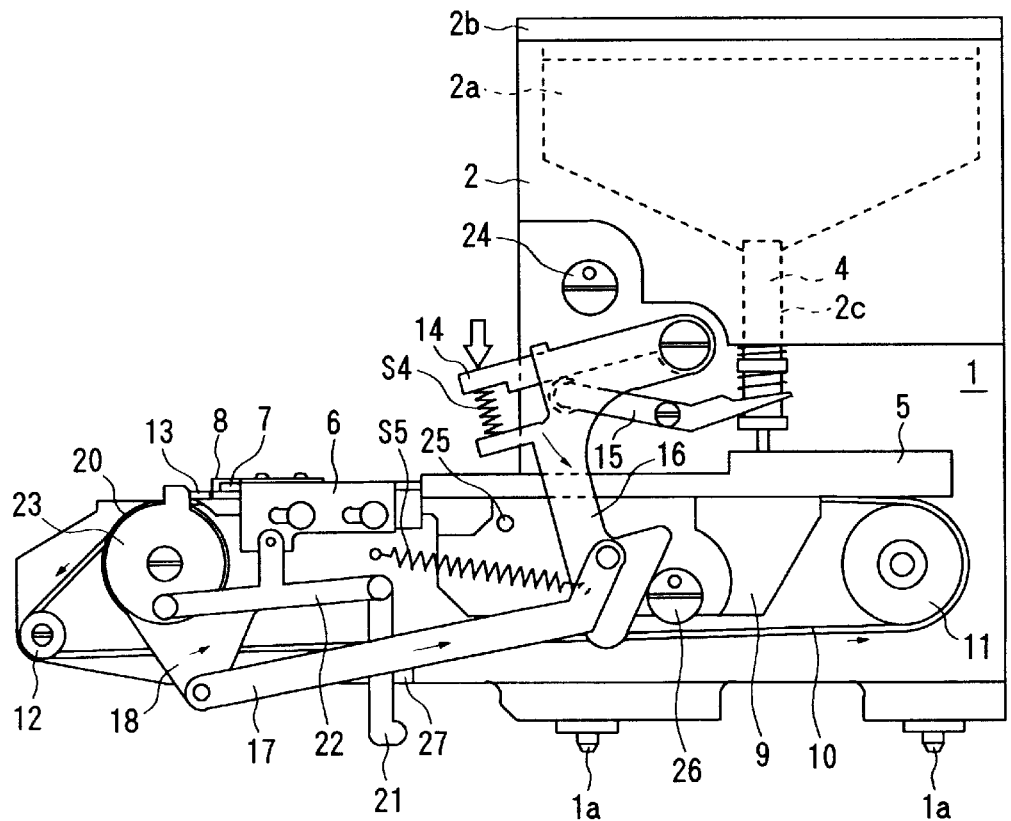
FIG. 7 is a side view showing a state where an end portion of a first operating lever is pressed in the apparatus in FIG. 1.
Figure 8:
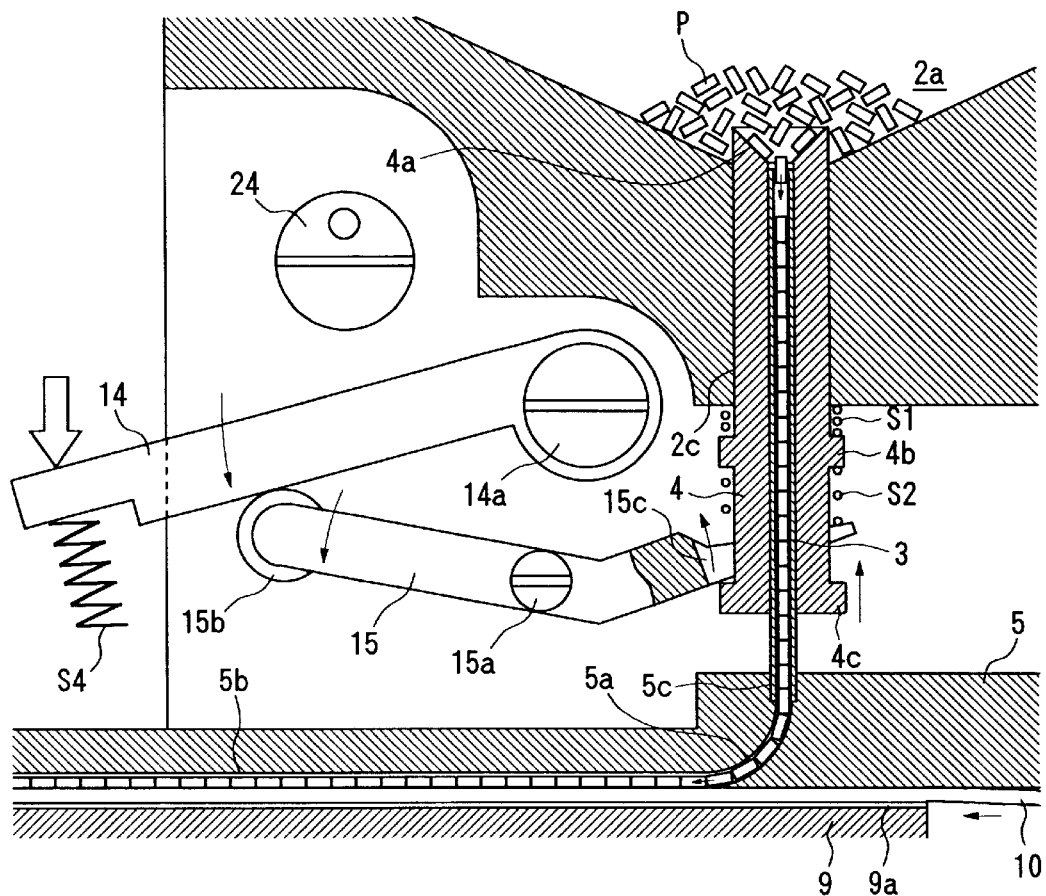
FIG. 8 is an enlarged partial longitudinal sectional view of FIG. 7.

When the end portion of the first operating lever 14 is pushed downward as shown with a white arrow in FIG. 7, the first operating lever 14 is rotated counterclockwise, as shown in FIG. 8, and the roller 15b of the pipe driving lever 15 is pushed downward, so that the pipe driving lever 15 is rotated counterclockwise. Thereby, the engaging portion 15c of the pipe driving lever 15 is ascended, and the movable pipe 4 is moved upward from the lowered position against the biasing force of the coil spring S1. Then, when the pressure acting upon the end portion of the first operating lever 14 is released, the movable pipe 4 is lowered from the ascended position by the biasing force of the coil spring S1, as shown in FIGS. 1 and 3, and the pipe driving lever 15 and the first operating lever 14 are returned to their home positions.

In both courses where the movable pipe 4 is ascended from the lowered position and is lowered from the ascended position, the storage components P positioned on or above the movable pipe 4 are subjected to stirring operation. Accordingly, directly or while the chip components P in the storage chamber 2a are guided by the guide face 4a, they are fed into the upper opening of the fixed pipe 3 one by one in their longitudinal direction. The respective chip components P fed into the fixed pipe 3 according to the ascending and lowering actions of the movable pipe 4 move downward due to their self-weights to enter into the curved path 5a below the lower end of the movable pipe 4. The chip components P which have entered into the curved path 5a move according to the curvature due to their self-weights, and their orientations are changed by 90° from vertical orientations to horizontal orientations, as shown in FIG. 8, and thereafter the chip components P are discharged from the end of the curved path 5a on the surface of the belt.

Figure 9:
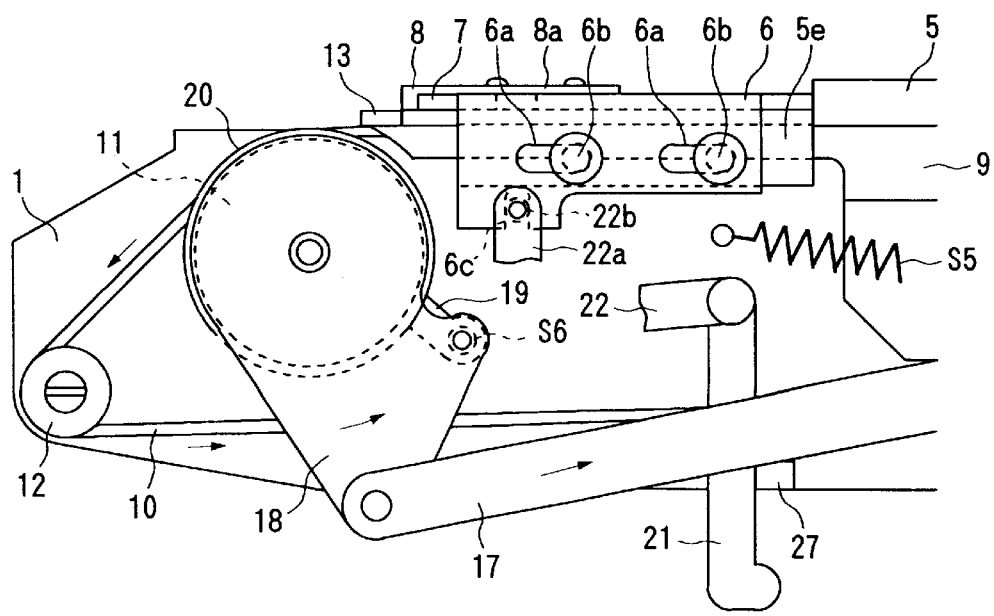
FIG. 9 is an enlarged partial side view of FIG. 7.
Figure 10:
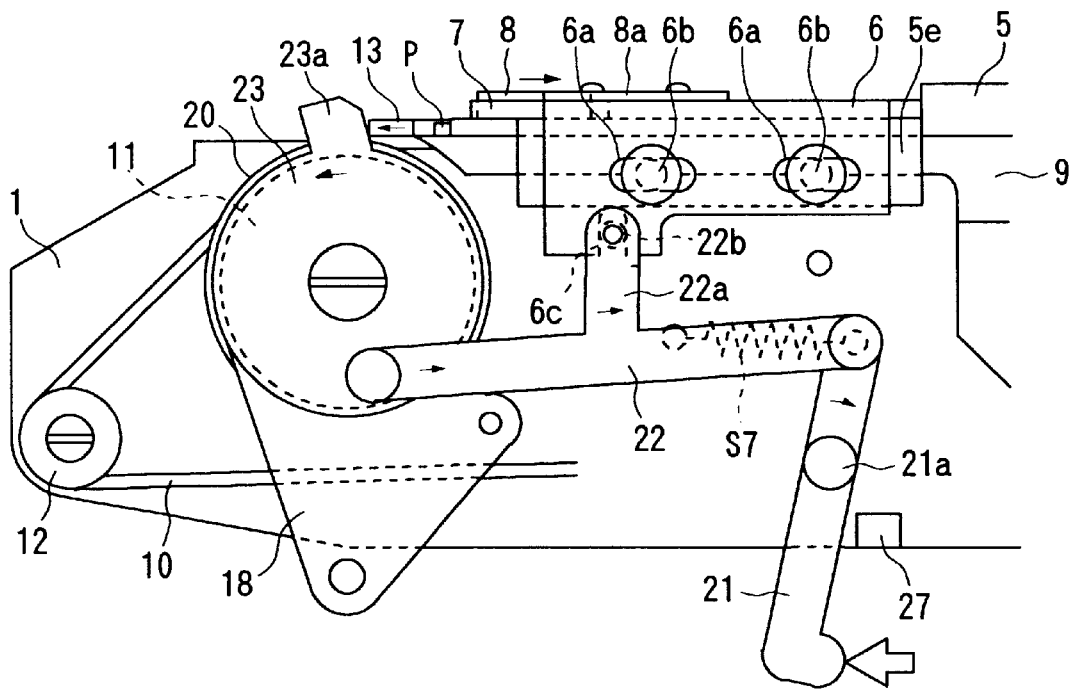
FIG. 10(A) is a partial side view showing a state where an end portion of a second operating lever is pressed in the apparatus in FIG. 1.
FIG. 10(B) is a plan view of FIG. 10(A) and FIG. 10(C) is an enlarged partial longitudinal sectional view in FIG. 10(A)
Figure 10:
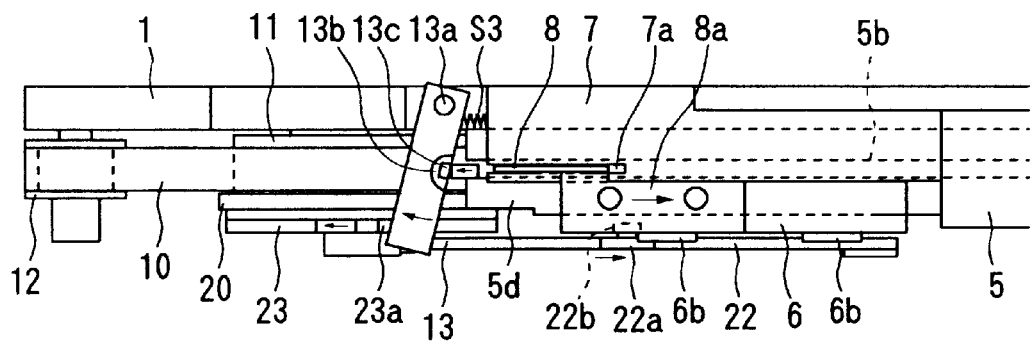
Figure 10:
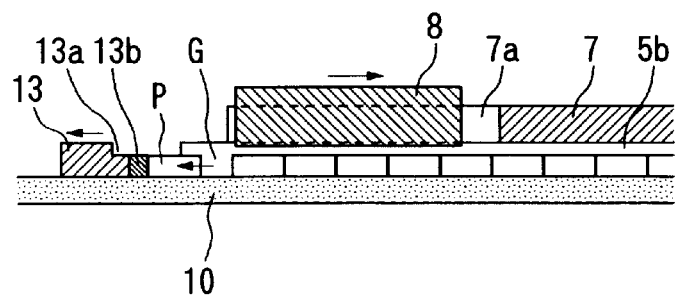
Figure 11:
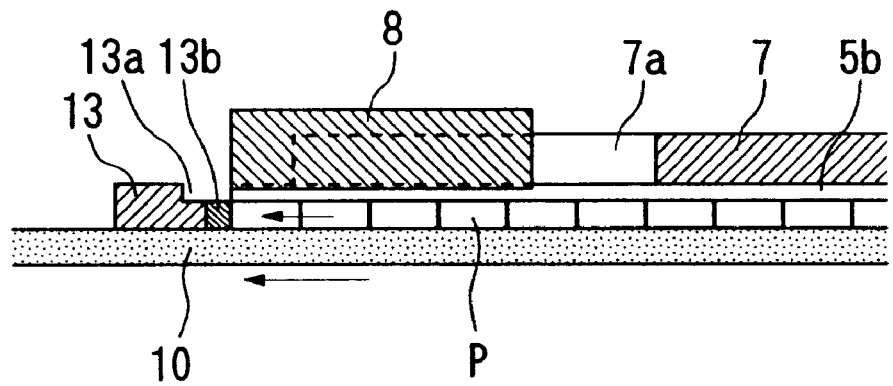
FIGS. 11(A) to 11(C) are views showing modified examples of motion of a slider.
Figure 11:
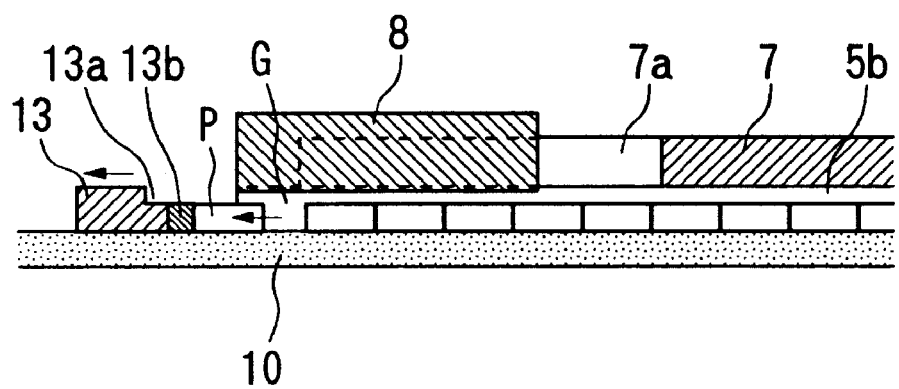
Figure 11:
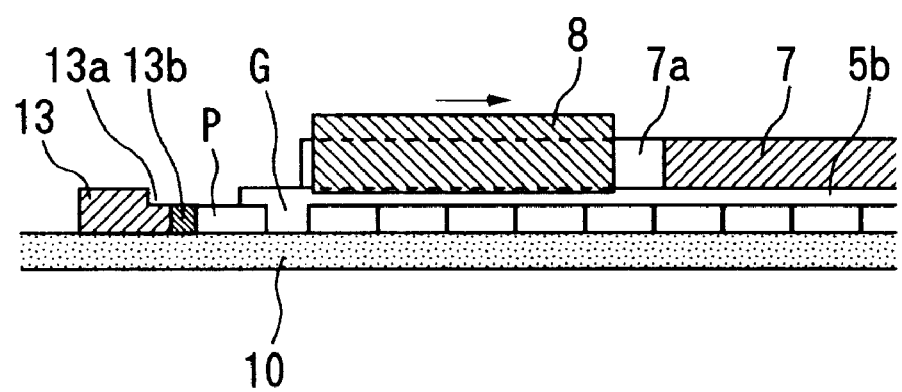

On the other hand, when the end portion of the first operating lever 14 is pushed downward as shown with the white arrow in FIG. 7, the end portion of the ratchet driving lever 16 is pushed downward via the coil spring S4, and the ratchet driving lever 16 is rotated counterclockwise against the biasing force of the coil spring S5. Thereby, as shown in FIG. 9, the relay lever 17 is retracted back and the ratchet driving plate 18 is rotated in the counterclockwise direction, and the ratchet wheel 20 in engagement with the ratchet 19 is rotated counterclockwise together with the front side main pulley 11 by a predetermined rotational angle, so that the upper side portion of the belt 10 is moved forward by a distance corresponding to the rotational angle, preferably, a distance longer than the length of the chip component P. Thereafter, as shown in FIG. 1, when pushing onto the end portion of the first operating lever 14 is released, the ratchet driving lever 16 is returned to its home position by the biasing force of the coil spring S5 while the ratchet wheel 20 and the front side main pulley 11 are left at their rotated positions, and the relay lever 17 and the ratchet driving plate 18 are returned to their home positions. In the returning course of the ratchet driving plate 18, the ratchet 19 is moved clockwise in a sliding manner on the outer periphery of the ratchet wheel 20 while it is being swung according to undulations of the ratchet wheel 20. The ratchet 19 is engaged with another groove of the ratchet wheel 20 when the ratchet driving plate 18 is returned.

When the upper side portion of the belt 10 is moved forward by a predetermined distance, the chip components P which have been discharged on the surface of the belt 10 are moved from the end of the curved path 5a forward together with the belt 10. The movement of the belt 10 is repeated intermittently at each time when the end portion of the first operating lever 14 is pushed, so that the chip components P are sequentially discharged on the surface of the belt 10 from the curved path 5a to be moved in the same manner as described above. While the chip components P moved forward by the belt 10 are subjected to alignment action effected by the linear groove 5b of the component guide 5, they are conveyed forward side by side in the longitudinal direction. As shown in FIGS. 5(A) to 5(C), since the rear face of the component stopper 13 abuts on the front end of the component guide 5 during movement of the belt, the chip components P moved forward in the aligned state are stopped when the leading chip component P abuts on the component stopper 13. Also, the leading chip component P which has abutted on the component stopper 13 is attracted to and held on the component stopper 13 by the magnetic force of the permanent magnet 13b.

In the course where the chip components P are conveyed forward with the aligned state and the leading chip component P abuts on the component stopper 13 so that the chip components P are stopped, as shown in FIGS. 5(A) to 5(C), the slider 8 is positioned at the advanced position where its front end conforms to the front end of the linear groove 5b, and covers some chip components P including the leading chip component P in a non-contacting state. Accordingly, even when an inertial force generated during conveyance of the components acts on the leading chip component P, the leading chip component P is securely prevented from standing up or flying out by the slider 8, so that the leading chip component P can be stopped with a suitable posture.

Also, since the width of the slit 7a is smaller than that of the chip component P, the chip component P is prevented from flying out externally. In addition thereto, since the slider 8 has a length corresponding to a plurality of chip components P, the posture of not only the leading chip component P but also the second leading chip component P are prevented from being disturbed.

On the other hand, after the first operating lever 14 is pushed and the pushing is released, the second operating lever 21 is rotated clockwise against the biasing force of the coil spring S7, as shown in FIGS. 10(A) to 10(C), when the end portion of the second operating lever 21 is pushed forward as shown with a white arrow in FIG. 10(A). Thereby, the relay lever 22 is retracted backward, and the slider driving plate 6 put in engagement with the roller 22b of the relay lever 22 is moved backward by a predetermined distance, so that the slider 8 moves backward along the slit 7a by a predetermined distance, preferably, a distance longer than the length of the chip component P. Simultaneously therewith, the stopper driving plate 23 rotates counterclockwise, and the component stopper 13 is rotated clockwise in FIG. 10(B) to depart from the front end of the component guide 5 by the biasing force of the coil spring S3 while it is kept in contact with the stopper driving plate 23. As the leading chip component P is attracted to and held on the permanent magnet 13b of the component stopper 13, the leading chip component P is moved forward to be separated from the second leading chip component P when the component stopper 13 is rotated clockwise, and a gap G is formed between the leading chip component P and the second leading chip component P. Thereafter, when the pushing onto the end portion of the second operating lever 21 is released, as shown in FIGS. 5(A) to 5(C), the second operating lever 21 is returned to the home position by the biasing force of the coil spring S7, and the relay lever 22, the slider driving plate 6, the slider 8 and the stopper driving plate 23 are returned to the home positions.

Taking-out of the leading chip component P by the suction nozzle is performed in a state where the slider 8 is retracted and the leading chip component P is separated from the second leading chip component P by the forward displacement of the component stopper 13, as shown in FIG. 10(C). Accordingly, when the leading chip component P is taken out, the leading chip component P is prevented from interfering with the second leading chip component P. As a result, the problems can be overcome about failure in taking-out due to interference of the leading chip component P with the second leading chip component P, so that taking-out of the chip components P from the apparatus can be performed in a extremely excellent manner.

Also, as the leading chip component P is attracted to and held on the permanent magnet 13b, when it is moved forward, the posture of the leading chip component P is prevented from being disturbed, so that the leading chip component P can be put in an appropriate posture until it is taken out by the suction nozzle.

Although in the above-described embodiment, the backward movement of the slider 8 and the forward movement of the component stopper 13 are simultaneously performed has been disclosed in the above-mentioned embodiment, such an operation procedure can be adopted that after the belt 10 is moved forward by the predetermined distance, the component stopper 13 is moved forward and thereafter the slider is moved backward, or such an operation procedure can be adopted that after the belt 10 is moved forward by the predetermined distance, the slider 8 is moved backward and thereafter the component stopper 13 is moved forward. The same operation and effect as the embodiment can be obtained in such operation procedures. Also, in the above embodiment, such a configuration has been disclosed that the conveying path for conveying the chip components P forward in the aligned state is structured by the belt 10 closing the lower opening of the linear groove 5b of the component guide 5, but the present invention can be configured such that the lower opening of the linear groove 5b is closed by a fixed member without the belt 10 and a driving mechanism therefor, or the linear groove 5b is formed in path shape without the lower opening and the intermittent conveyance of the chip components P is conducted by blowing-out of air from the rear side of the path or sucking air from the front side thereof.

Furthermore, in the above embodiment, such a structure that the component suction portion comprising the permanent magnet 13b is provided in the component stopper 13 is disclosed as an example, but an air suction hole may be provided in the component stopper 13 instead of the permanent magnet 13b and a negative pressure is supplied to the suction hole, so that a component suction similar to the above can be performed.

The preferred embodiment described in the body of the specification is illustrative and it does not limit the present invention. The scope of the present invention is shown in the appended claims, and all modifications or variations included in the meanings of the claims are included in the present invention.

What is claimed is:

1. An electronic component supplying apparatus for conveying electronic components in an aligned state and supplying the same to a predetermined take-out position, comprising:

a conveyor for intermittently conveying the electronic components in an aligned state in a predetermined direction along a conveying path;

a component stopper on which a leading electronic component of the electronic components abuts during component conveyance;

a slider for covering at least the leading electronic component abutting the component stopper; and a slider displacement mechanism for displacing the slider in a direction opposite to a component conveying direction to allow the leading electronic component to be taken out in a state where the component conveyance by the conveying path is stopped.

2. The apparatus according to claim 1, wherein:

the length of the slider is longer than the size of each electronic component in the component conveying direction, and the slider covers a plurality of the electronic components including the leading electronic component.

3. The apparatus according to claim 1, wherein:

a slit extending along the component conveying direction is formed on an upper face of a front end of the conveying path, and the slider is movably disposed in the slit.

4. The apparatus according to claim 3, wherein:

the widths of the slit and the slider are smaller than the size of each electronic component in a direction perpendicular to the component conveying direction.

5. The apparatus according to claim 1, further comprising:

a stopper displacement mechanism for displacing the component stopper in the component conveying direction in a state where the component conveyance by the conveying path is substantially stopped.

6. The apparatus according to claim 5, wherein:

the component stopper and the slider are arranged so the displacement of the component stopper provided by the stopper displacement mechanism and the displacement of the slider provided by the slider displacement mechanism are simultaneously performed.

7. The apparatus according to claim 5, wherein:

the component stopper and the slider are arranged so the displacement of the slider provided by the slider displacement mechanism is performed after the displacement of the component stopper provided by the stopper displacement mechanism.

8. The apparatus according to claim 5, wherein:

the component stopper and the slider are arranged so the displacement of the component stopper provided by the stopper displacement mechanism is performed after the displacement of the slider provided by the slider displacement mechanism.

9. The apparatus according to claim 5, further comprising:

a component suction portion for sucking the leading electronic component abutting the component stopper;

wherein the component sucking portion and the component stopper are arranged so the leading electronic component is separated from a second leading component when the component stopper is displaced in the component conveying direction.

10. The apparatus according to claim 9, wherein:

the component suction portion includes a permanent magnet located in the component stopper.

11. The apparatus according to claim 5, wherein:

the stopper displacement mechanism and the slider displacement mechanism have a common operating lever.

12. The apparatus according to claim 11, wherein:

the component conveyance of the conveying path includes a suction source for sucking air from a front side of the conveying path.

13. The apparatus according to claim 11, wherein:

the component conveyance of the conveying path includes a source of air for blowing air into a rear side of the conveying path.

\* \* \* \* \*